(12) United States Patent
Lee et al.

(10) Patent No.: US 7,696,104 B2
(45) Date of Patent: Apr. 13, 2010

(54) MIRROR PACKAGE AND METHOD OF MANUFACTURING THE MIRROR PACKAGE

(75) Inventors: Seung Wan Lee, Suwon-si (KR); Min Seog Choi, Seoul (KR); Hwa Sun Lee, Suwon-si (KR); Won Kyoung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 290 days.

(21) Appl. No.: 11/437,651

(22) Filed: May 22, 2006

(65) Prior Publication Data

US 2007/0166864 A1 Jul. 19, 2007

(30) Foreign Application Priority Data

Dec. 30, 2005 (KR) .................. 10-2005-0135136

(51) Int. Cl.
*H01L 21/302* (2006.01)
(52) U.S. Cl. .................. 438/753; 438/745; 216/33; 216/34
(58) Field of Classification Search .................. 438/745, 438/750, 754, 7, 743, 756; 216/97, 99, 33, 216/34, 35, 97.99
See application file for complete search history.

(56) References Cited

U.S. PATENT DOCUMENTS

| 5,440,352 | A | | 8/1995 | Deter et al. | |
|---|---|---|---|---|---|
| 6,002,507 | A | * | 12/1999 | Floyd et al. | 359/201 |
| 6,154,305 | A | | 11/2000 | Dickensheets et al. | |
| 6,381,022 | B1 | * | 4/2002 | Zavracky | 356/454 |
| 6,794,272 | B2 | * | 9/2004 | Turner et al. | 438/459 |
| 7,160,791 | B2 | * | 1/2007 | Yang | 438/455 |
| 2002/0141062 | A1 | | 10/2002 | Christoffersen et al. | |
| 2002/0163704 | A1 | | 11/2002 | Hayashi et al. | |
| 2002/0181838 | A1 | | 12/2002 | Cunningham et al. | |
| 2003/0118277 | A1 | * | 6/2003 | Yu et al. | 385/18 |
| 2005/0157376 | A1 | | 7/2005 | Huibers et al. | |
| 2005/0269710 | A1 | * | 12/2005 | Lee et al. | 257/774 |

FOREIGN PATENT DOCUMENTS

| JP | 56-098079 A | 8/1981 |
|---|---|---|
| JP | 06-204776 A | 7/1994 |
| JP | 2002-6117 A | 1/2002 |
| KR | 10-1989-0011373 A | 8/1989 |
| KR | 10-1999-0040462 A | 6/1999 |
| KR | 10-2001-0109738 A | 12/2001 |
| WO | 03040801 A1 | 5/2003 |

* cited by examiner

*Primary Examiner*—Lan Vinh
(74) *Attorney, Agent, or Firm*—Sughrue Mion, PLLC

(57) ABSTRACT

A mirror package is provided which can reflect a laser to an external screen according to a video signal when the laser enters from outside, and a method of manufacturing the mirror package. The mirror is packaged with a glass to protect from external contamination, an inlet and an outlet are formed by, for example, an anisotropic etching on the glass and blocks a reflected light reflected from the glass. The mirror package is formed as a set, combined on a wafer using a wafer level package and diced to individual chips. Subsequently, a productivity is improved and a ghost image or phenomenon is removed.

9 Claims, 8 Drawing Sheets

MIRROR PACKAGE AND METHOD OF MANUFACTURING THE MIRROR PACKAGE

CROSS-REFERENCE TO RELATED APPLICATION

This application claims priority from Korean Patent Application No. 10-2005-0135136, filed on Dec. 30, 2005, in the Korean Intellectual Property Office, the disclosure of which is incorporated herein by reference.

BACKGROUND OF THE INVENTION

1. Field of the Invention

The present invention relates to a mirror package and a method of manufacturing the same and, more particularly, to a mirror package which can effectively remove a ghost image by blocking a reflected light of a laser reflected from a glass, and prevent the reflected light from being emitted externally, and also can be easily manufactured on a wafer level, and a method of manufacturing the same.

2. Description of the Conventional Art

Currently, a need for a large size display has increased due to an increase in a standard of living and an arrival of a multimedia era. Accordingly, various types of large size displays are being rapidly developed and a laser television (TV) is presented as a next generation display which is inexpensive, large, and also can achieve a high resolution.

A laser TV is provided with an optical scanner scanning a laser beam projected from a laser module in a horizontal and a vertical direction according to an RGB (Red Green Blue) video signal. The optical scanner includes a mirror which is manufactured on a basis of MEMS (Micro-Electro Mechanical System) technology. A laser is reflected by the mirror and projected to an external screen.

The mirror is packaged using a glass and the like, for protection from humidity and external dust. Structurally, the mirror reflects an external laser. In this instance, a ghost image creating an unwanted image along with a desired image may occur by a projection of a reflected light on a screen via a glass.

A ghost may be a noise that an image which is identical with or different from a desired image continuously occurs on an area of a TV screen. The ghost image occurs due to refractive index differences of glass and a reflection property of a laser, and due to the fact that a light interferes with a reflected light, generating an unwanted image.

Figure 1:
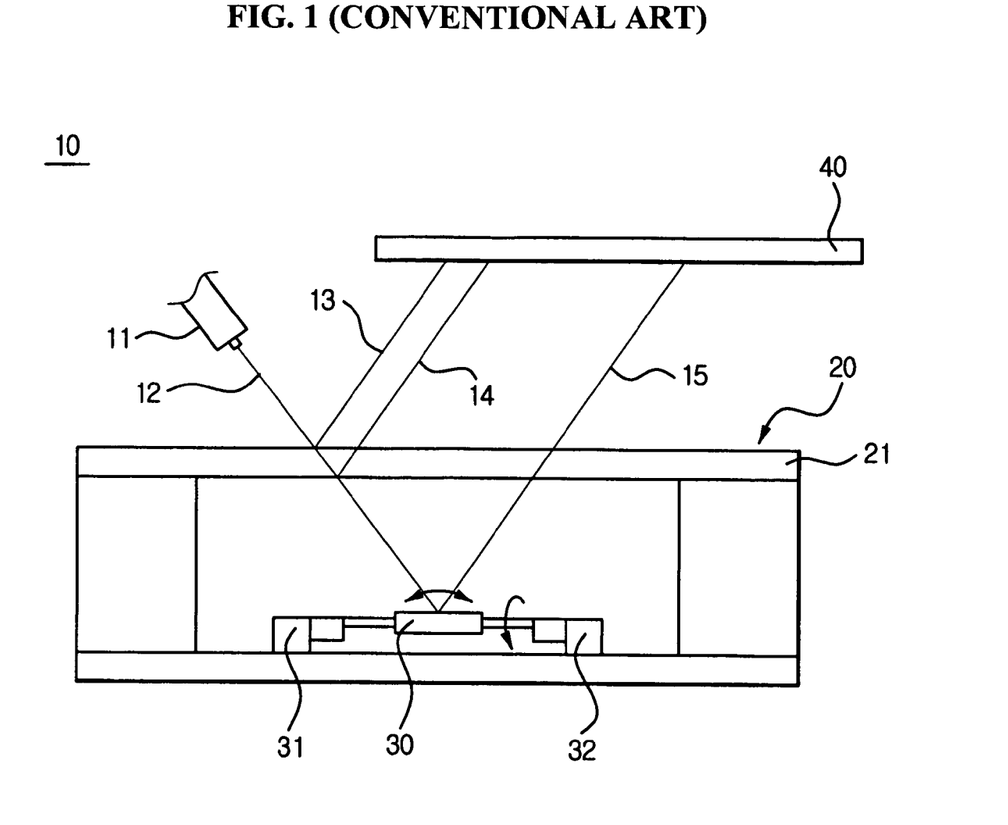
FIG. 1 is a configuration diagram showing an optical scanner with a conventional mirror.

Conventional art will be further described in detail with reference to FIG. 1. FIG. 1 is a configuration diagram illustrating an optical scanner 10 with a mirror 30 according to a conventional art. As shown in FIG. 1, with reference to the optical scanner 10, the entering laser 12 from the light source 11 is projected to an inside of the mirror package 20 including the mirror 30. The entering laser 12 is reflected as at 15 from the mirror 30 and creates an image on an external screen 40 of the mirror package 20. In this instance, the mirror 30 vibrates on two axes to make the entering laser 15 reach a desired point on the screen. For the mirror 30 to vibrate on two axes, a vibrating unit 31 of a first axis and a vibrating unit 32 of a second axis perpendicular to the first axis are utilized. For convenience, a more detailed description related thereto will be omitted herein.

The mirror 30 is sealed with a glass 21 for protection from external dust and the like, the entering laser 12 reaches the mirror 30 via the glass 21. In this instance, with reference to the entering laser 12, a ghost image occurs due to a first reflected light 13 from a front surface of the glass 21 and a second reflected light 14 from a back surface of the glass 21, creating an unwanted image on the screen 40.

In order to remove the ghost image, a method of controlling an angle of a reflected and refracted light by tilting the glass 21 to a predetermined angle is provided, however, the manufacture of an apparatus utilizing this method may not be easy and an additional design may be necessary. Also, in the case of manufacturing the glass 21 to be tilted, a wafer level package may not be possible so that productivity may be severely hampered as every chip may be required to be individually packaged.

Also, while a method of a surface treatment, such as a non-reflection coating or the like on a surface of the glass 21, is taken into consideration, the method may not completely remove a ghost image and may increase a manufacturing process and a manufacturing cost.

SUMMARY OF THE INVENTION

The present invention provides a mirror package for a laser TV which can effectively remove a ghost image by blocking a reflected light of a laser reflected from a glass, and prevent the reflected light from being emitted externally.

The present invention also provides a mirror package for a laser TV which can be suitable for mass production with improved productivity due to a wafer level package.

The present invention also provides a mirror package for a laser TV which can readily control a width of a lateral face of an inlet and an outlet blocking so that a substantial amount of reflected light is not emitted to the outside.

According to an aspect of the present invention, there is provided a mirror package provided with a mirror for reflecting a laser entering from an outside to an external screen according to a video signal, and a method of manufacturing the mirror package. A plurality of inlets through which the laser may enter and a plurality of outlets through which the laser may be emitted are formed, for example, by an anisotropic etching on the silicon wafer are also provided.

In particular, there is provided a mirror package comprising a mirror for reflecting a laser entering from an outside toward an external screen according to an image signal, the mirror package comprising a mirror wafer having a plurality of mirrors, a glass wafer combined with an upper portion of the mirror wafer so as to seal the mirror wafer, and a silicon wafer comprising an inlet which allows the laser to enter and an outlet which allows the laser to be reflected from the mirror, the silicon wafer being placed on an upper portion of the glass wafer so that the glass wafer combines with a surface of the silicon wafer where the inlet and the outlet are substantially formed, wherein a combined wafer formed by combining the mirror wafer, the glass wafer and the silicon wafer is diced so that the inlet, the outlet and the mirror are each included in the combined wafer.

Further, there is provided a method of manufacturing a mirror package in a mirror structure, the method comprising providing a silicon wafer, forming an inlet, through which a laser is able to pass, and an outlet, through which the laser is able to be emitted, by anisotropic etching the silicon wafer, and forming a wafer module by combining the silicon wafer, a glass wafer made of a transparent material and a mirror wafer formed with the mirror structure, so that the glass wafer combines with a surface of the silicon wafer where the inlet and the outlet are substantially formed.

The inlet and outlet may be wet etched by using any one of potassium hydroxide (KOH), ethylene diamine pyrotechol (EDP), and tetramethyle ammonium hydroxide (TMAH), and a shape of the inlet and outlet is a quadrangular pyramid and an angle between a lateral face of the inlet and a surface of the silicon wafer may range from about 50 degrees to about 60 degrees.

According to another aspect of the present invention, there is provided a mirror package provided with a layered plurality of silicon wafers whose respective inlets and outlets formed on each silicon wafer overlap each other. In this instance, the size of the inlet and the outlet formed on each of the layered plurality of silicon wafers may decrease as a distance from the glass wafer increases.

Consistent with the present invention, a ghost image may be effectively removed by blocking a reflected light of a laser from a glass from being emitted to the outside, a manufacturing method which includes tilting a glass is not necessary so that a wafer level package is simplified, and a mirror package suitable for a mass production and improved productivity is provided. Also, a width of a lateral face of an inlet and outlet serves to block a reflected light so that an extensively reflected light is not emitted to the outside.

BRIEF DESCRIPTION OF THE DRAWINGS

The above and/or other aspects and advantages of the present invention will become apparent and more readily appreciated from the following detailed description, taken in conjunction with the accompanying drawings, of which.

DETAILED DESCRIPTION OF ILLUSTRATIVE, NON-LIMITING EMBODIMENTS OF THE INVENTION

Reference will now be made in detail to illustrative, non-limiting embodiments of the present invention, examples of which are illustrated in the accompanying drawings, wherein like reference numerals refer to the like elements throughout. The embodiments are described below in order to explain the present invention by referring to the figures.

In general, a silicon wafer with an crystallographically isotropic property becomes etched in a pattern of a serial half spheres, while a silicon wafer with an anisotropic property becomes etched in a pattern of a quadrangular pyramid. In a silicon wafer with an anisotropic property, an etching speed in a direction different from a miller index (111) is slower than an etching speed in the direction of a miller index (100) and (110). In this instance, in the case a silicon wafer having an anisotropic property is wet etched with a etching solution, a ratio of an etching speed to a direction of a miller index (111):(100):(110) is about 1:300 to 400:600. Consequently, according to the ratio of an etching speed, an etching is processed in shape of a quadrangular pyramid with an inclination of a lateral face from a horizontal in a range of about 54.74 degrees. The angle of 54.74 degrees is a crystal plane 111 and an etching face may be etched by exposing the face.

Figure 2:
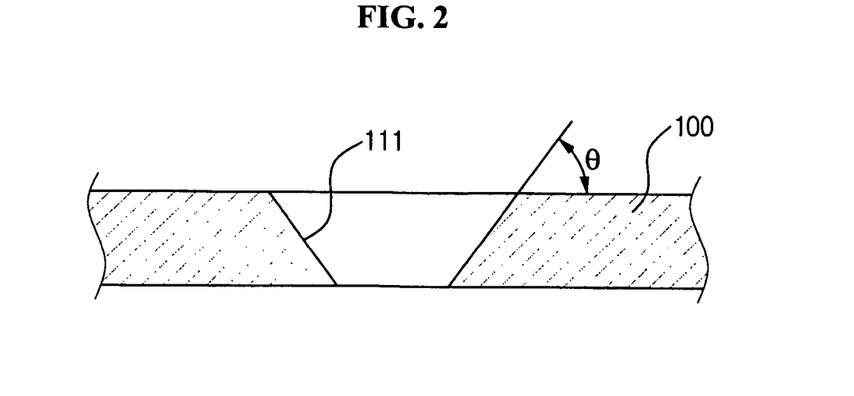
FIG. 2 is a cross-sectional view showing the silicon wafer 100 with an anisotropic property that is wet etched according to an embodiment of the present invention.

This is shown in FIG. 2. FIG. 2 is a cross-sectional view showing the silicon wafer 100 with an anisotropic property that is wet etched. As shown in the illustration, the silicon wafer 100 forms an angle θ of 54.74 degrees between an etched face of the silicon wafer and the surface of a lateral face 111 by exposing the face. The angle θ is naturally formed when performing an anisotropic etching.

Figure 3:
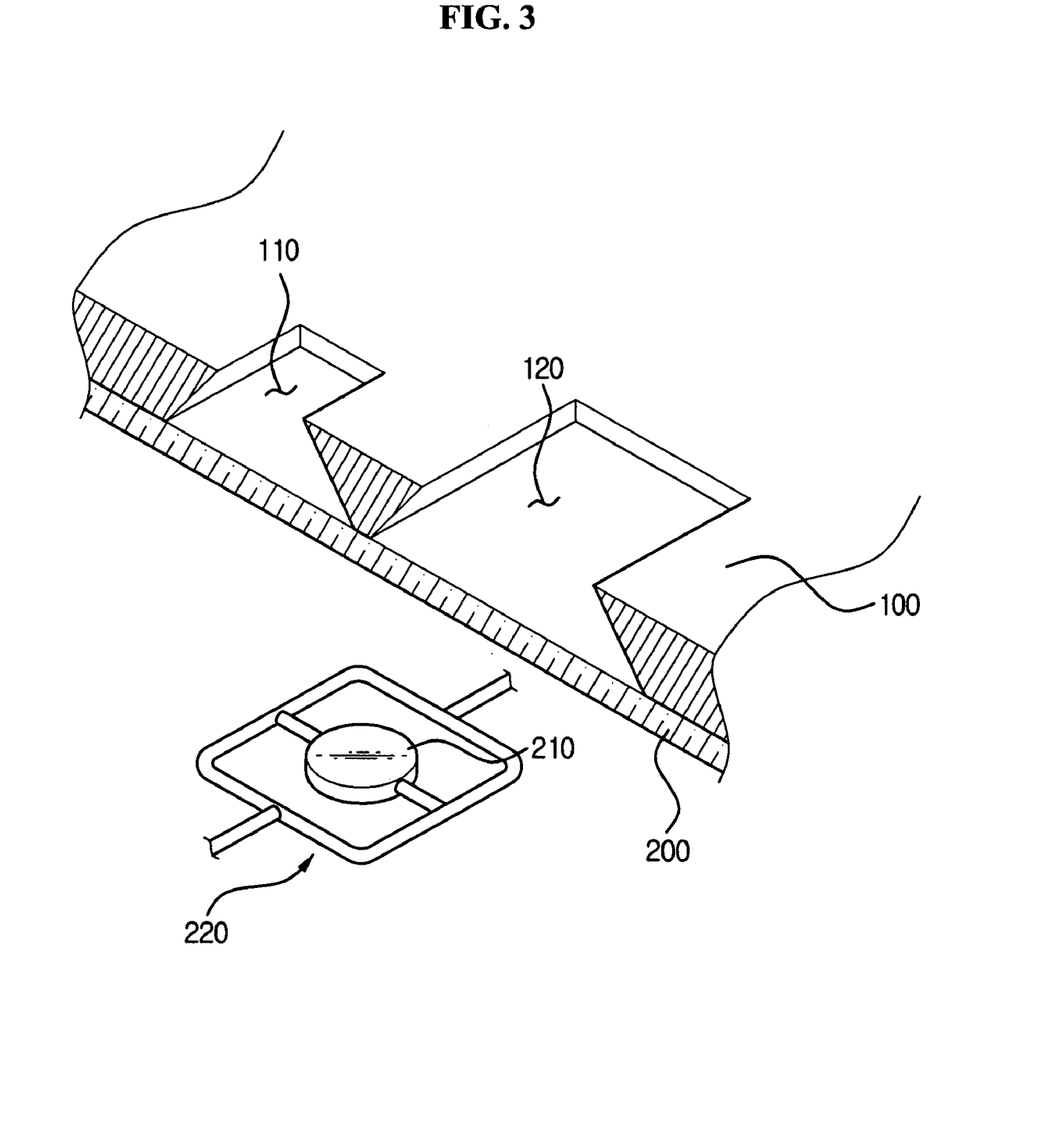
FIG. 3 is a perspective view of a mirror package according to an embodiment of the present invention.
Figure 4:
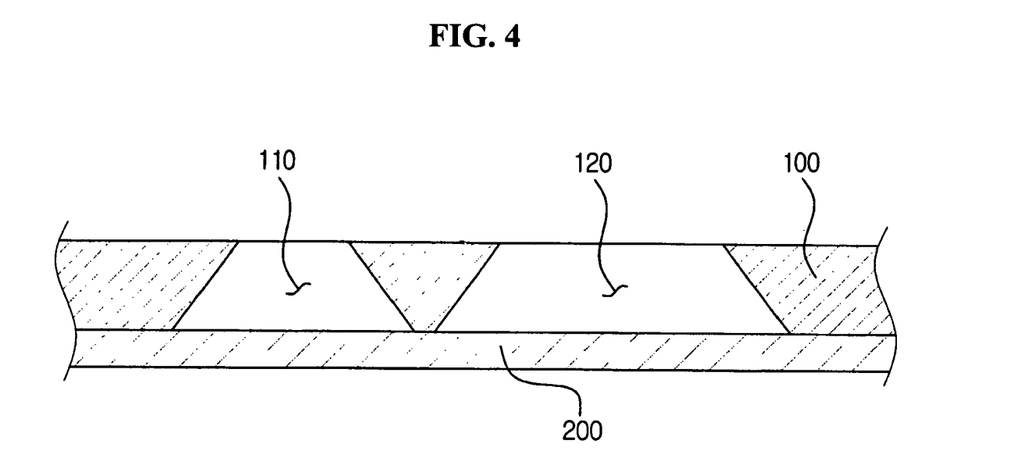
FIG. 4 is a cross-sectional -view of a silicon wafer and a glass wafer according to an embodiment of the present invention.

The present invention using these properties is shown in FIG. 3 and FIG. 4. FIG. 3 is a perspective view of a mirror package and FIG. 4 is a cross sectional view of a silicon wafer and a glass wafer according to an aspect of the present invention.

As shown in the illustration, an inlet 110 and an outlet 120 are formed on a silicon wafer 100. The inlet 110 is an entrance for a laser to enter and the outlet 120 is an exit for the laser to be emitted.

An angle between an etched face and the surface of the silicon wafer 100 is theoretically about 54.74 degrees in the inlet 110 and the outlet 120. The silicon wafer 100 is combined with the glass wafer 200 by a contacting area, in this instance, where the inlet 110 and the outlet 120 are substantially formed on the silicon wafer 100 and the glass wafer 200 are combined. That is, once the inlet 110 and the outlet 120 are formed by etching the silicon wafer 100, an upper side of the inlet 110 and outlet 120 is substantially removed and formed in a quadrangular pyramid, and the lateral face is at an angle of about 54.74 degrees from the surface. This is shown in FIG. 2. The silicon wafer 100 is overturned after etching, where an upper side of the inlet 110 and outlet 120 are substantially formed, and combined with the glass wafer 200.

Figure 5:
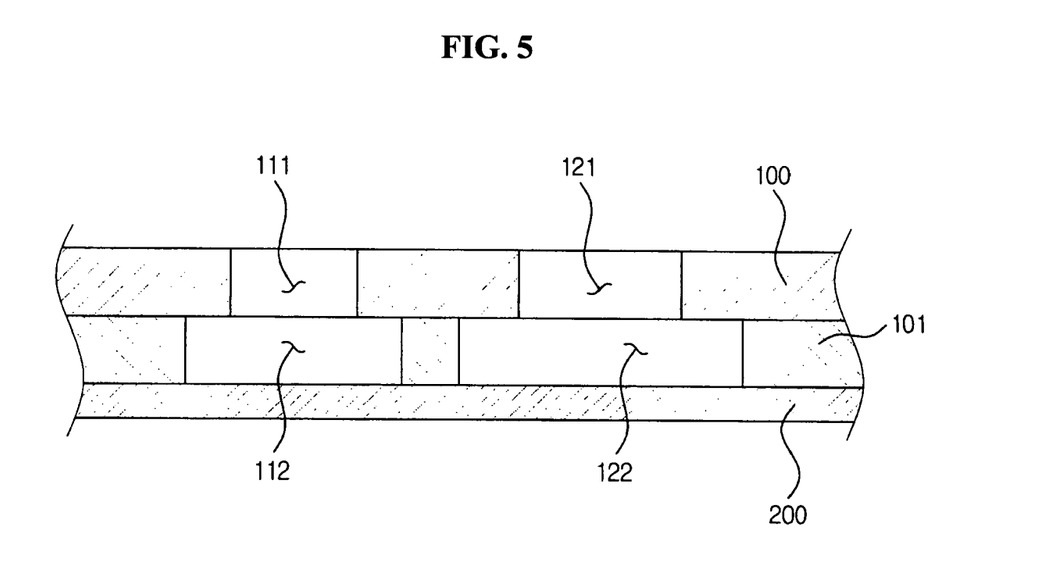
FIG. 5 is a cross-sectional view of a plurality of silicon wafers formed by using etching according to an embodiment of the present invention.

According to another embodiment of the present invention, as shown in FIG. 5, the present invention comprises a plurality of silicon wafers 100 and 101, the inlet and the outlet respectively formed on each silicon wafer may overlap each other. In other words, a plurality of silicon wafers may be layered sufficiently high so as to not emit a reflected light to the outside. Also, the inlets 111 and 112 and the outlets 121 and 122 may be formed by a wet etching and a dry etching, as well.

Figure 6:
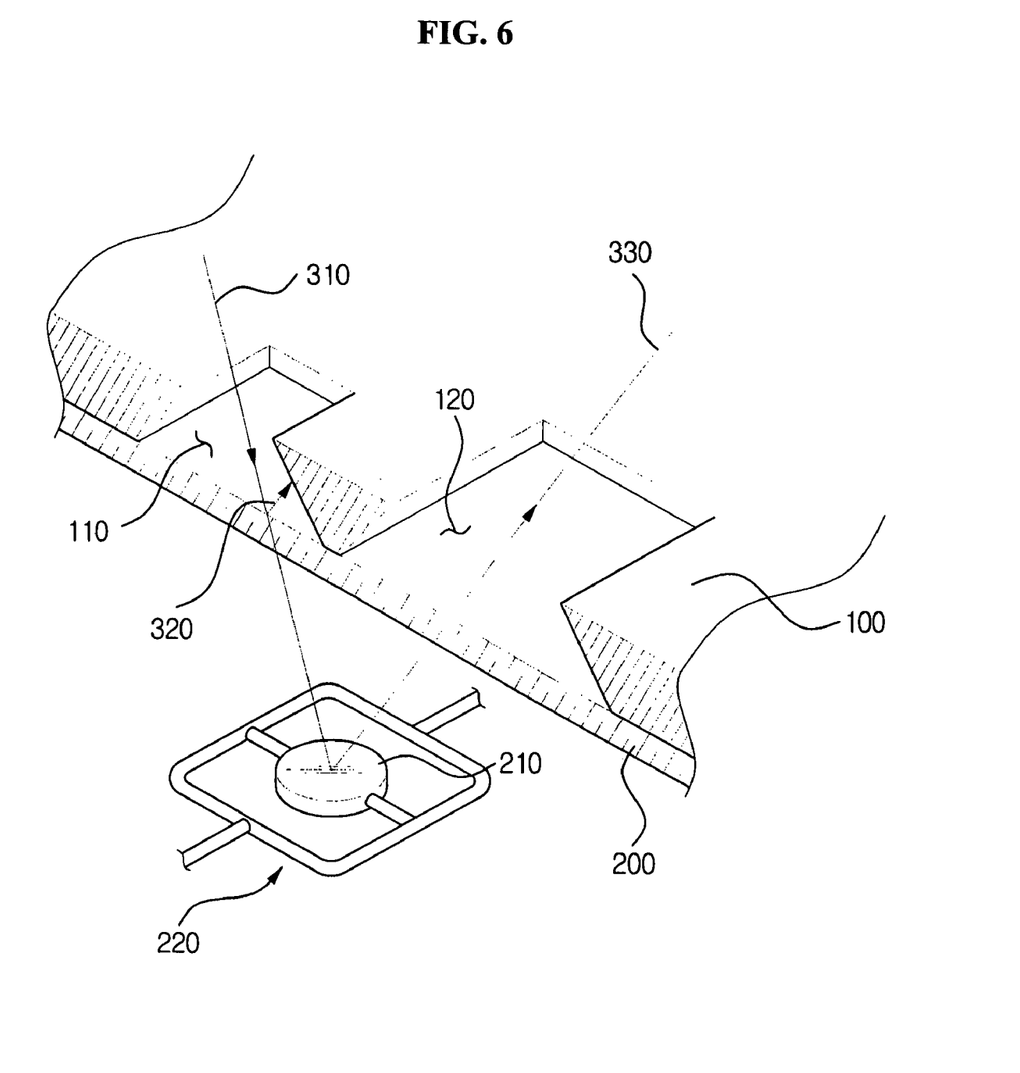
FIG. 6 is a perspective view illustrating a blocking of a reflected light from a front surface of a glass wafer according to an embodiment of the present invention.

As shown in FIG. 6, the glass wafer 200 protects a mirror from humidity and external dust by packaging the mirror 210 reflecting a laser to an outside according to a video signal and a mirror driving unit 220 drives the mirror 210. The glass wafer 200 is made of a transparent material to pass a laser.

As described above, a portion of the laser is reflected by the glass wafer 200, thereby creating a ghost image or phenomenon, an unwanted image included in a desired image. The present invention is provided in order to demonstrate a theory of preventing a ghost image, as shown in FIG. 6 and FIG. 7.

Figure 7:
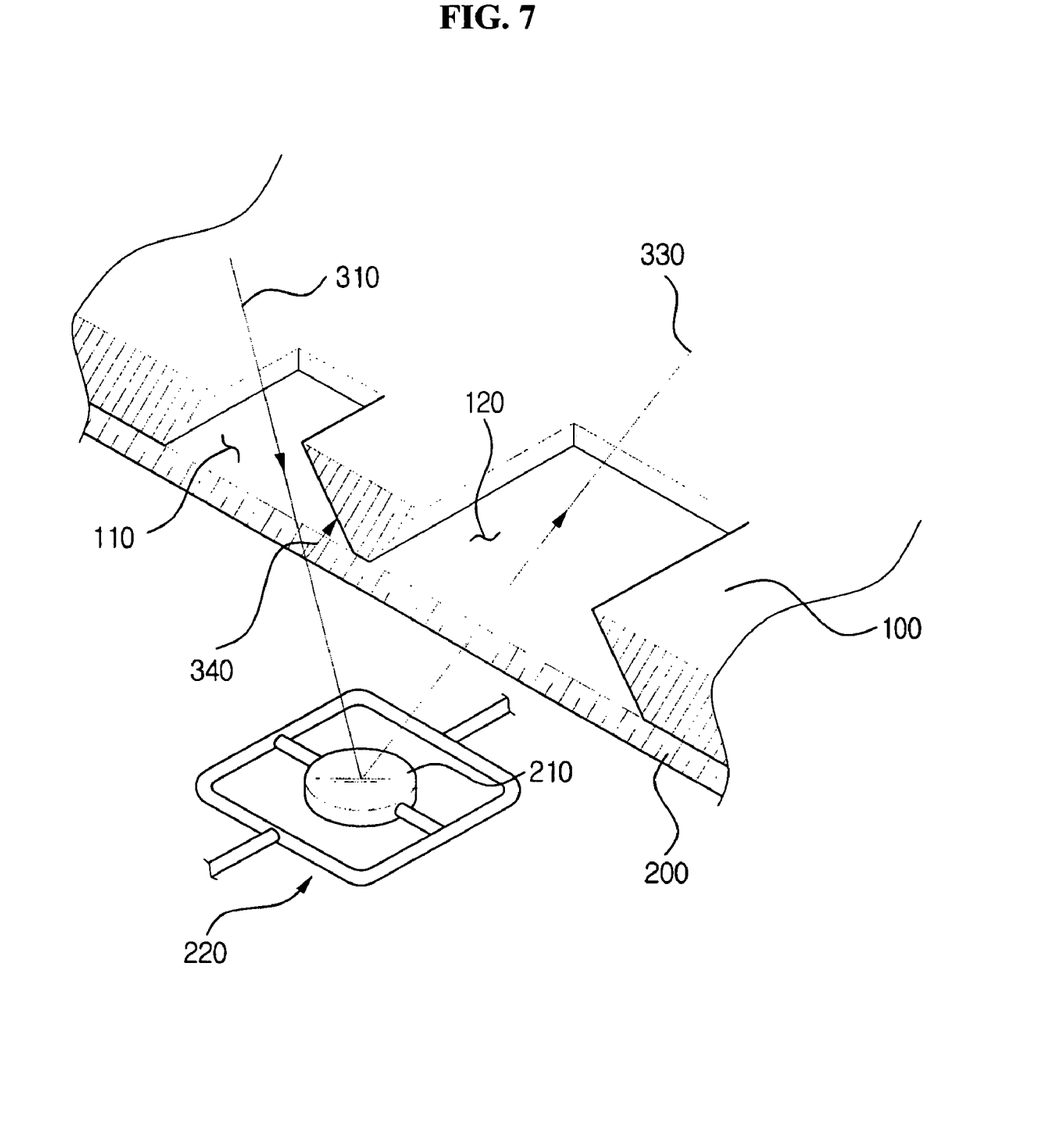
FIG. 7 is a perspective view illustrating a blocking of a reflected light from a back surface of a glass wafer according to an embodiment of the present invention.

FIG. 6 is a perspective view showing a blocking of a reflected light 320 from a front surface of a glass wafer 200 and FIG. 7 is a perspective view showing a blocking of a reflected light 340 from a back surface of a glass wafer 200.

As shown in FIG. 6, an entering laser 310 passes through the inlet 110 and the bottom of the glass wafer 200, and is reflected by a mirror 210 and projected to an external screen via the outlet 120. In this instance, the first reflected light 320 is blocked by a lateral face of the inlet 110 and is not emitted to an outside. In other words, in a conventional art, a reflected light may not be blocked and thereby cause interference with the emitting laser 330 or may independently project to an outside and create an unwanted image. In the present invention, a tilted lateral face by an anisotropic etching in the inlet 110 blocks the first reflected light 320.

As shown in FIG. 7, the second reflected light 340 is blocked by a lateral face of the inlet 110 and is not emitted to an outside. A laser is a sort of a light, accordingly a reflection may occur from an upper side of the glass wafer 200, and even if a light passes through the upper surface of the glass wafer 200, a reflection may occur from a lower side of the glass wafer 200. The reflected light mentioned above is blocked, so that a creation of an unwanted image, such as a ghost image, is prevented. Blocking a light reflected in the inlet 110 is an example for this embodiment, however, various light, such as a reflected light, refracted light, and the like, may be blocked in the silicon wafer 100.

A method of manufacturing the present invention is as follows.

Figure 8:
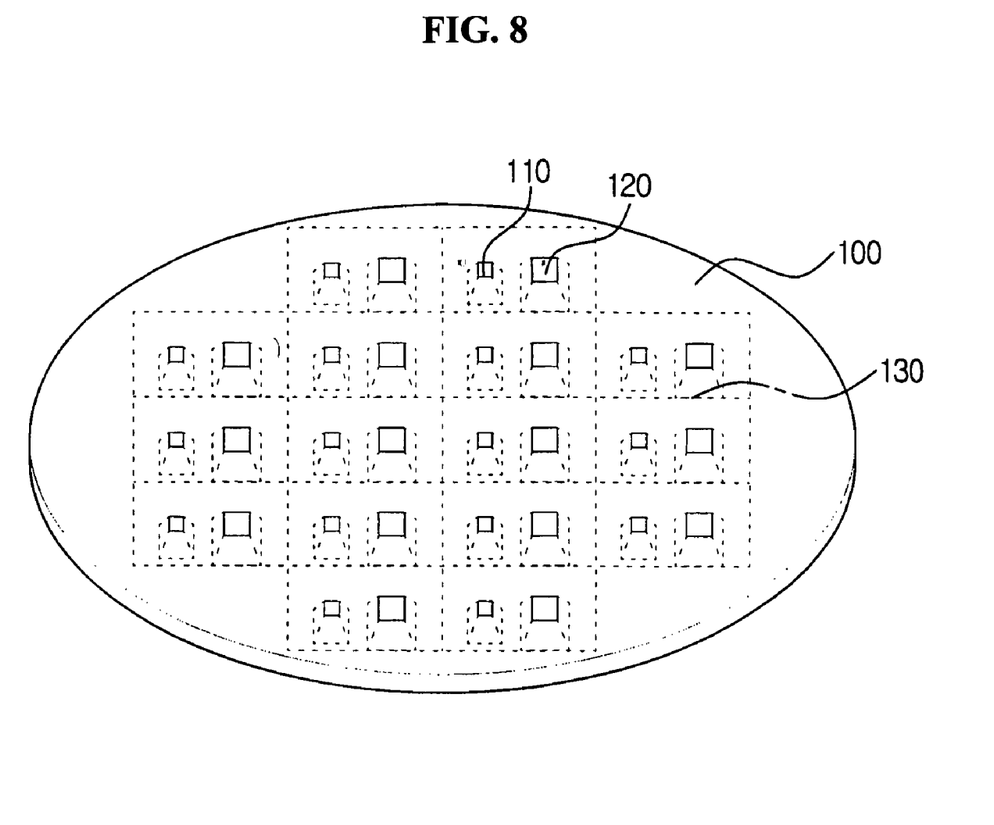
FIG. 8 is a front view of showing a plurality of inlet and outlets formed on a silicon wafer according to an embodiment of the present invention.
Figure 9:
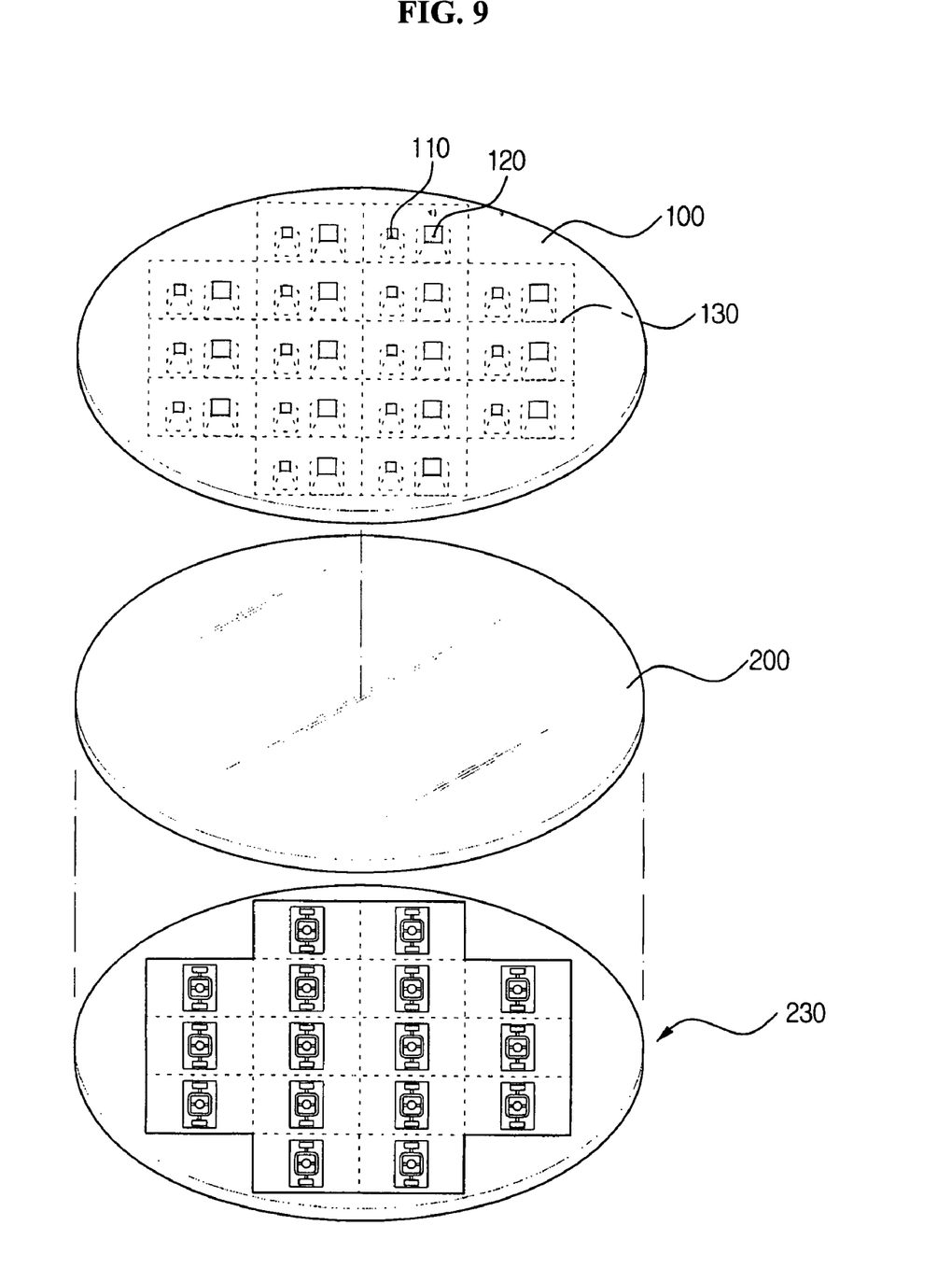
FIG. 9 is a perspective view showing a silicon wafer, a glass wafer and a mirror wafer combined with each other according to an embodiment of the present invention.
Figure 10:
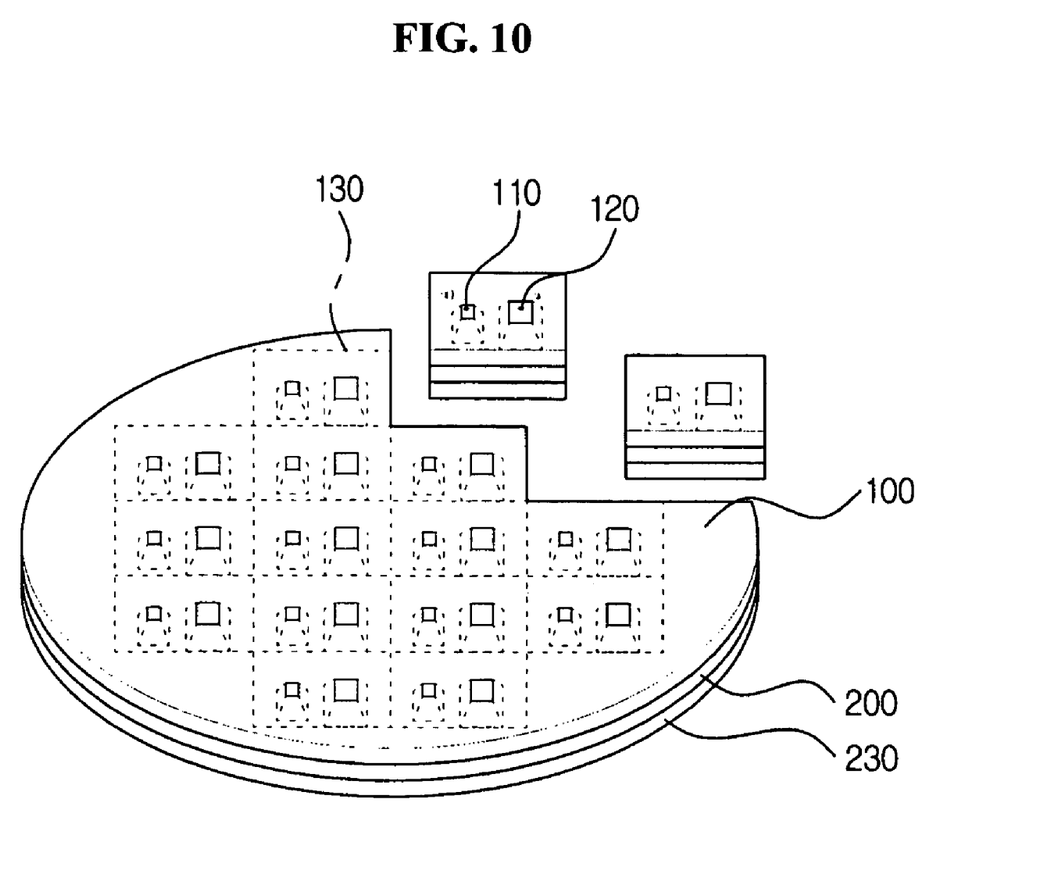
FIG. 10 is a perspective view showing the combined wafers diced along a dicing line according to an embodiment of the present invention.

FIG. 8 is a front view showing a plurality of inlets and outlets formed on a silicon wafer, FIG. 9 is a perspective view showing a silicon wafer, a glass wafer and mirror wafer combined with each other, and FIG. 10 is a perspective view showing the combined wafers diced along a dicing line.

As shown in FIG. 8, forming the inlet 110 and outlet 120 may be performed by an anisotropic etching the silicon wafer 100. The anisotropic etching may be a wet etching which uses any one of potassium hydroxide (KOH), ethylene diamine pyrotechol (EDP) and tetramethyle ammonium hydroxide (TMAH). The shape of the inlet 110 and the outlet 120 formed by anisotropic etching is a quadrangular pyramid and a lateral face of the inlet 110 and outlet 120 may be about 54.74 degrees from a surface of the silicon wafer 100. In practice, an angle between a lateral face of the inlet 110 and a surface of the silicon wafer 100 may range from 50 degrees to 60 degrees, unlike a theoretical angle.

In order to improve productivity, a plurality of inlets 110 and outlets 120 are formed on the silicon wafer 100. That is, the silicon wafer 100 is divided into many portions and each portion includes an inlet 110 and an outlet 120. This is for realizing a wafer level package when manufacturing. A wafer level package is a manufacturing technology of manufacturing a whole wafer of individual chips at one time, unlike a conventional art, and assembling and packaging a chip diced from a wafer, after manufacturing a plurality of individual chips on the wafer in which each chip is not yet separated therefrom, to produce a plurality of individual chips simultaneously. According to the present invention, tilting a glass may not be necessary to prevent a ghost image, unlike the conventional art, and productivity may be improved by using a wafer level package.

Combining a glass wafer 200 under the silicon wafer 100 having inlets 110 and outlets 120, and forming a wafer module by combining the mirror wafer 230 having a mirror under the glass wafer 200 is shown in FIG. 9.

In this instance, the silicon wafer 100 is overturned after an etching and combined with the glass wafer 200. As described above, the silicon wafer 100 is overturned after an etching, where an upper side of the inlet 110 and outlet 120 are substantially formed, and combined with the glass wafer 200. A mirror is formed on the mirror wafer 230 at every portion created according to a dicing line on the silicon wafer 100. This is to manufacture a plurality of individual chips simultaneously.

As for a combining method, an epoxy may be used to combine, and an anodic bonding adding a high voltage to an adhesive after combining the silicon wafer 100 and the glass wafer 200 via an energy may be used. Polishing and flattening the two surfaces to be combined may be necessary before combining them.

Also, the silicon wafer and the glass wafer may be made of a material having a similar coefficient of thermal expansion. This is to prevent a loss of a reliability of a mirror package due to a thermal expansion caused by a thermal change.

As shown in FIG. 10, production is completing by dicing the combined wafers 100, 200 and 230 along a dicing line 130. Accordingly, a ghost image may be eliminated by blocking a reflected light from a glass from being emitted to the outside, a plurality of productions may be simultaneously manufactured at a wafer level, a glass may not be required to be tilted, and a mirror package with a low cost and increased productivity may be provided. In the case of thickening a width of a lateral face of an inlet, stacking a plurality of the silicon wafers 100 may be necessary to prevent an extensive amount of reflected light from being emitted to the outside. In this instance, a shape of the inlet 110 and the outlet 120 formed on each silicon wafer 100 may differ because an entering laser and an exiting laser may not be interfered with by stacking a plurality of silicon wafers 100. More particularly, in the case of forming a lower silicon wafer which is combined with a glass wafer and an upper silicon wafer which is combined on top of the glass wafer, inlets and outlets formed on the upper silicon wafer may be formed lager than inlets and outlets formed on the lower silicon wafer. A width of a lateral face of inlets and outlets may be readily formed so as to prevent a ghost image caused by a reflected light emitted to the outside.

According to the present invention, a ghost is effectively removed by blocking a reflected light of a laser from a glass.

Also, according to the present invention, in order to remove a ghost image, a manufacturing step of tilting a glass may not be necessary, thereby a wafer level package may be simple, may be suitable for mass production, and may have improved productivity.

Also, a width of a lateral face of an inlet and outlet readily controlled to block an extensively reflected light from being emitted externally may be embodied.

Although a few exemplary embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A method of manufacturing a mirror package in a mirror structure, the method comprising:
   providing a silicon wafer;
   forming an inlet, through which a laser is able to pass from the outside, and an outlet, through which the laser is able to be emitted to the outside, by anisotropic etching of the silicon wafer; and
   forming a wafer module by combining the silicon wafer, a glass wafer made of a transparent material, and a mirror wafer formed with the mirror structure, so that the glass wafer combines with a surface of the silicon wafer where the inlet and the outlet are substantially formed, and the glass wafer is disposed between the silicon wafer and the mirror wafer, wherein a width of the surface of the inlet that combines with the glass wafer is larger than a width of an opposite surface of the inlet, and a width of the surface of the outlet that combines with the glass wafer is larger than a width of an opposite surface of the outlet.

2. The method of claim 1, wherein the forming of the inlet and outlet comprises a wet etching using any one of potassium hydroxide (KOH), ethylene diamine pyrotechol (EDP), and tetramethyle ammonium hydroxide (TMAH).

3. The method of claim 1, further comprising forming the inlet and the outlet on each of a plurality of silicon wafers, and arranging the silicon wafers such that the respective inlets overlap each other and the respective outlets overlap each other.

4. The method of claim 1, further comprising:
    forming a plurality of inlets and outlets on the silicon wafer;
    forming a set of the mirror structures on the mirror wafer;
    forming a combined wafer by combining the silicon wafer, the glass wafer and the mirror wafer together; and
    dicing the combined wafer to include the inlet, the outlet and the mirror structure in each diced combined wafer.

5. The method of claim 1, wherein the silicon wafer and the glass wafer are made of materials having similar coefficients of thermal expansion.

6. The method of claim 1, wherein each of the inlet and the outlet forms a rectangular pattern on the silicon wafer, and forms a hole through the silicon wafer in the shape of a quadrangular pyramid by anisotropic etching.

7. The method of claim 6, wherein an angle between a lateral face of the inlet and a surface of the silicon wafer ranges from approximately 50 degrees to approximately 60 degrees.

8. A method of manufacturing a mirror package in a mirror structure, the method comprising:
    providing a silicon wafer;
    forming an inlet, through which a laser is able to pass from the outside, and an outlet, through which the laser is able to be emitted to the outside, by anisotropic etching of the silicon wafer;
    forming a wafer module by combining the silicon wafer, a glass wafer made of a transparent material, and a mirror wafer formed with the mirror structure, so that the glass wafer combines with a surface of the silicon wafer where the inlet and the outlet are substantially formed, and the glass wafer is disposed between the silicon wafer and the mirror wafer; and
    forming the inlet and the outlet on each of a plurality of silicon wafers, and arranging the silicon wafers such that the respective inlets overlap each other and the respective outlets overlap each other,
    wherein a size of the inlets formed on the respective silicon wafers decreases as a distance from the glass wafer increases, and a size of the outlets formed on the respective silicon wafers decreases as a distance from the glass wafer increases.

9. A method of manufacturing a mirror package in a mirror structure, the method comprising:
    providing a silicon wafer;
    forming an inlet, through which a laser is able to pass from the outside, and an outlet, through which the laser is able to be emitted to the outside, by anisotropic etching of the silicon wafer;
    forming a wafer module by combining the silicon wafer, a glass wafer made of a transparent material, and a mirror wafer formed with the mirror structure, so that the glass wafer combines with a surface of the silicon wafer where the inlet and the outlet are substantially formed, and the glass wafer is disposed between the silicon wafer and the mirror wafer; and
    forming the inlet and the outlet on each of a plurality of silicon wafers, and arranging the silicon wafers such that the respective inlets overlap each other and the respective outlets overlap each other,
    wherein each of the inlets and outlets is formed by a dry etching, such that a size of the inlets formed on the respective silicon wafers decreases as a distance from the glass wafer increases, and a size of the outlets formed on the respective silicon wafers decreases as a distance from the glass wafer increases.

* * * * *